United States Patent [19]

Wirth et al.

[11] Patent Number: 4,484,170

[45] Date of Patent: Nov. 20, 1984

[54] DOT MATRIX PRINT HEAD SOLENOID ASSEMBLY

[75] Inventors: Robert L. Wirth, Ithaca; David E. Weeks, Newfield; John W. Reece, Ithaca, all of N.Y.

[73] Assignee: NCR Corporation, Dayton, Ohio

[21] Appl. No.: 470,011

[22] Filed: Feb. 25, 1983

[51] Int. Cl.³ .................... H01F 15/10; H05K 3/32; H05K 1/00

[52] U.S. Cl. ............................ 336/65; 29/839; 29/840; 336/192; 361/405; 400/124

[58] Field of Search ............... 29/839, 840; 400/124, 400/157.2, 719; 101/93.05; 361/404, 405; 336/65, 192

[56] References Cited

U.S. PATENT DOCUMENTS

| | | | |
|---|---|---|---|
| 2,913,634 | 11/1959 | Scoville | 361/404 X |
| 3,139,560 | 6/1964 | Phillips | 361/405 X |
| 3,184,532 | 5/1965 | Spera | 29/839 X |
| 3,213,325 | 10/1965 | Lindstrand | 361/404 |
| 3,385,732 | 5/1968 | Curran | 361/404 X |
| 3,486,224 | 12/1969 | Chaney | 29/838 |
| 3,825,999 | 7/1974 | Rubey | 361/409 X |
| 4,105,985 | 8/1978 | Plunkett | 336/192 X |
| 4,122,425 | 10/1978 | Hughes | 336/192 |
| 4,242,719 | 12/1980 | Conley | 361/405 X |
| 4,244,658 | 1/1981 | Mori | 400/124 |
| 4,345,231 | 8/1982 | Cline et al. | 336/192 |
| 4,347,552 | 8/1982 | Pearcy et al. | 361/405 X |

FOREIGN PATENT DOCUMENTS

| | | | |
|---|---|---|---|
| 1804961 | 6/1970 | Fed. Rep. of Germany | 29/839 |
| 2742716 | 4/1979 | Fed. Rep. of Germany | 361/405 |

Primary Examiner—Paul T. Sewell
Attorney, Agent, or Firm—J. T. Cavender; Wilbert Hawk, Jr.; George J. Muckenthaler

[57] ABSTRACT

A plurality of solenoid bobbins or bobbin wound coils are collectively attached to and supported from one surface of a printed circuit board and the coil wires are securely connected to the conductors on the board.

12 Claims, 7 Drawing Figures

DOT MATRIX PRINT HEAD SOLENOID ASSEMBLY

CROSS-REFERENCE TO RELATED APPLICATIONS

Dot Matrix Print Head, co-pending application, Ser. No. 470,012, Filed Feb. 25, 1983, invented by David E. Weeks, John W. Reece and Robert L. Wirth, and assigned to NCR Corporation.

Dot Matrix Print Head, co-pending application Ser. No. 470,013, filed Feb. 25, 1983, invented by David E. Weeks, Robert L. Wirth and John W. Reece, and assigned to NCR Corporation.

BACKGROUND OF THE INVENTION

In the field of printing, the most common type has been the printer which impacts against record media that is caused to be moved past a print line or line of printing. As is well-known, the impact printing operation depends upon the movement of impact members, such as print hammers or wires or the like, which are typically moved by means of an electromechanical system and which may, in certain applications, enable a more precise control of the impact members.

In the field of dot matrix printers, it has been quite common to provide a print head which has included therein a plurality of print wire actuators or solenoids arranged or grouped in a manner to drive the respective print wires a precise distance from a rest or non-printing position to an impact or printing position. The print wires are generally either secured to or engaged by the solenoid plunger or armature which is caused to be moved such precise distance when the solenoid coil is energized and wherein the plunger normally operates against the action of a return spring.

It has also been quite common to provide an arrangement for grouping of such solenoids in a circular configuration to take advantage of reduced space available in the manner of locating the print wires in that area from the solenoid to the front tip of the print head adjacent the record media. In this respect, the actuating ends of the print wires are spaced in accordance with the circular arrangement and the operating or working ends of the print wires are closely spaced in vertically-aligned manner adjacent the record media. The availability of narrow or compact actuators permits a narrower print head to be used and thereby reduces the width of the printer because of the reduced clearance at the ends of the print line. The print head can also be made shorter because the narrow actuators can be placed in side-by-side manner closer to the record media for a given amount of wire curvature.

In the wire matrix printer, the print head structure may be a multiple-element type with the wire elements aligned in a vertical line and supported on a print head carriage which is caused to be moved or driven in a horizontal direction for printing in line manner, while the drive elements or transducers may be positioned in a circular configuration with the respective wires leading to the front tip of the print head.

Alternatively, the printer structure may include a plurality of equally-spaced, horizontally-aligned, single-element print heads which are caused to be moved in back-and-forth manner to print successive lines of dots in making up the lines of characters. In this latter arrangement, the drive elements or transducers are individually supported along a line of printing. These single wire actuators or solenoids are generally tubular or cylindrically shaped and include a shell which encloses a coil, an armature, and a resilient member arranged in manner and form wherein the actuator is operable to cause the print wire to be axially moved a small precise distance in dot matrix printing.

In the concept of dot matrix printing, it is generally desired to place the print element actuators in a position to allow characters to be printed in serial manner and this placement requires that the print wire or like print element actuators be very closely spaced with respect to each other. Since the print actuators are generally much larger in the size than the diameter of the printed dot, a relatively long wire or like element must be provided to bring the desired print activity from its source, such as a moving armature or plunger or the like, to a vertical closely-spaced column arranged in a pattern such that a column of closely-spaced, tangentially coincident dots will be produced on the record media if all actuators are fired or actuated at one time.

Representative documentation in the design of a dot matrix print head includes U.S. Pat. No. 2,338,865, issued to L. L. Matson on Jan. 11, 1944, which discloses a body having a pair of spaced holes through an end portion and a lead wire extends through one hole, across the end portion and through the other hole, after which the lead wire end may be cemented in place.

U.S. Pat. No. 3,184,532, issued to F. T. Spera on May 18, 1965, discloses a device adapted for attachment to a printed circuit panel having elements on an insulating board and including an aperture and a notch or recess for receiving a lead wire of the device. Each cylindrical element has grooves for the lead wires which are bent and soldered in place.

U.S. Pat. No. 3,486,224, issued to W. O. Chaney on Dec. 30, 1969, discloses a method of securing a coil form to a printed circuit board by inserting coil form mounting feet through holes in the board and passing coil ends through other holes associated with circuit elements on the board and then soldering the coil ends.

U.S. Pat. No. 3,536,869, issued to F. H. Renshaw on Oct. 27, 1970, discloses a switch device for use with printed circuit boards and having a plug with slots along the side for mounting contact blades.

And, U.S. Pat. No. 3,991,347, issued to R. D. Hollyday on Nov. 9, 1976, U.S. Pat. No. 4,103,267, issued to W. W. Olschewski on July 25, 1978, and U.S. Pat. No. 4,249,229, issued to T. E. Hester on Feb. 3, 1981, disclose various means for securing electrical devices to circuit board or like substrate members.

SUMMARY OF THE INVENTION

The present invention relates generally to impact printing devices for dot matrix printing wherein at least one print wire is caused to be propelled against a printing medium by an associated clapper-type solenoid-actuated, print wire driver for printing dot matrix characters in accordance with external control signals which cause energization of the actuating coil and movement of the print wire for enabling printing of the characters. More particularly, the present invention relates to a solenoid arrangement for a wire matrix print head having a plurality of solenoids formed in a circular configuration and wherein the actuating coil of each solenoid is directly connected with and supported from a printed circuit board.

Each solenoid coil is wound on a bobbin and each such bobbin includes a pair of grooved posts or like portions or extensions which fit into mating apertures in the circuit board. The ends of the coil wires are trained into and along the grooves of the posts and then are solder-connected with the printed circuit board conductors.

In view of the above discussion, the principal object of the present invention is to provide an improved print head having a plurality of print wire solenoids.

Another object of the present invention is to provide an improved wiring connection for the print wire solenoids.

An additional object of the present invention is to provide means for mounting the print wire actuating coils for enabling simple wiring connections.

A further object of the present invention is to provide a circuit board for supporting a plurality of print wire actuating coils and means for electrically connecting such actuating coils thereto.

Additional advantages and features of the present invention will become apparent and fully understood from a reading of the following description taken together with the annexed drawing.

DESCRIPTION OF THE PREFERRED EMBODIMENT

Figure 1:
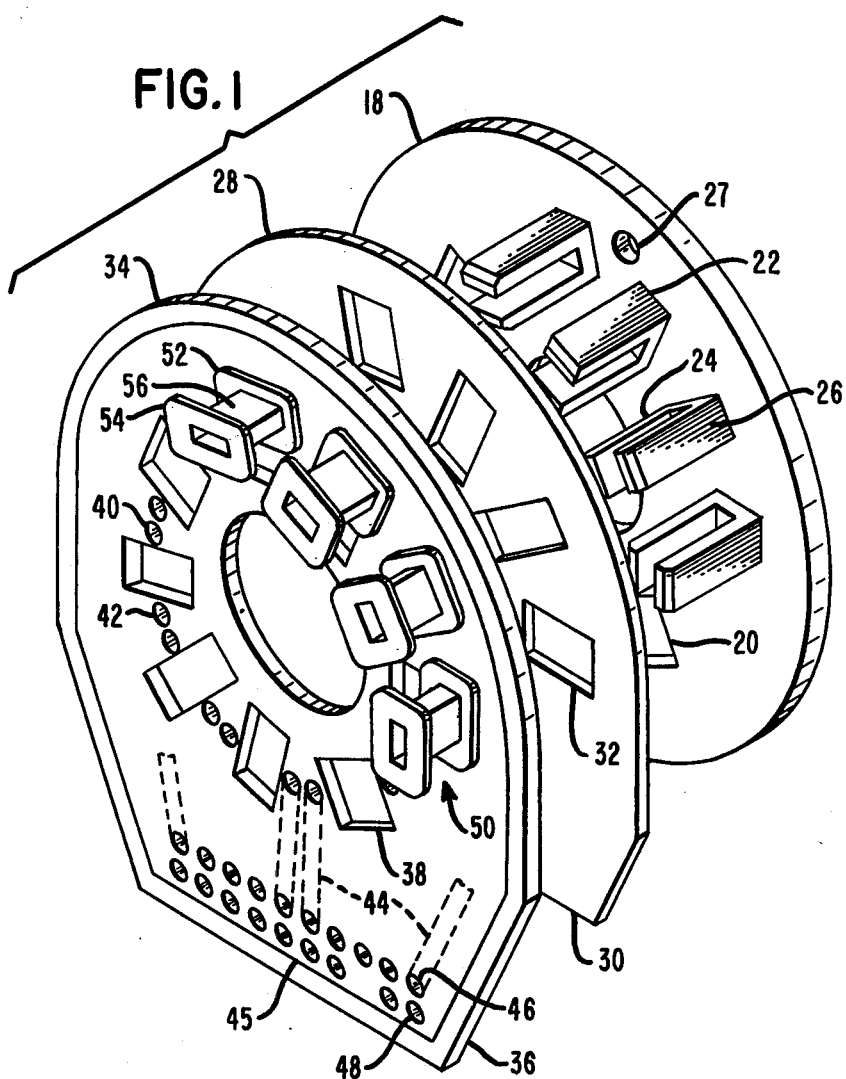
FIG. 1 is a perspective view showing certain parts of a print head in exploded manner.

FIG. 1 is an illustration, in exploded manner, of several of the parts included in the present invention and wherein a backplate 18, of circular shape and having spaced apertures or windows 20 therein, carries a plurality of U-shaped magnetic core members 22 each of which comprises inner and outer poles 24 and 26. A hole 27 is provided in the backplate 18 for a ground connection. An insulating spacer 28 of paper or like material is provided next to the backplate 18 and has a lower portion 30 and a plurality of apertures or windows 32 for receiving the pole portions 24 and 26 of the core members 22. Next is a printed circuit board 34 likewise of similar shape as the spacer 28 and having a lower portion 36 and including a plurality of apertures or windows 38 therein corresponding generally in location and size with the windows 32 in the spacer 28. Each of the three elements, i.e. the backplate 18, the spacer 28 and the circuit board 34 includes a central aperture therein for receiving a member for fastening the three elements in a wire matrix print head, the details of which are disclosed in the above-mentioned co-pending application, Ser. No. 470,013.

A pair of copper-lined holes 40 and 42 are positioned adjacent each window 38 in the printed circuit board 34 and copr runs or conductors 44 extend on one side (the back side in FIG. 1) of the board from certain ones of such holes 40 and 42 to copper-lined holes 46 formed in a row along the lower portion 36. A second row of copper-lined holes 48 is positioned just below the holes 46 for connecting with other ones of the holes 40 and 42 on the other side (the front side in FIG. 1) of the circuit board, which front side includes a copper coating or plating 45 thereon for connecting the common or neutral portion of each circuit. The construction of the copper runs or conductors on a printed circuit board 34 is well-known, as are the connectors typically used to connect with the conductors on the circuit board.

Figure 2:
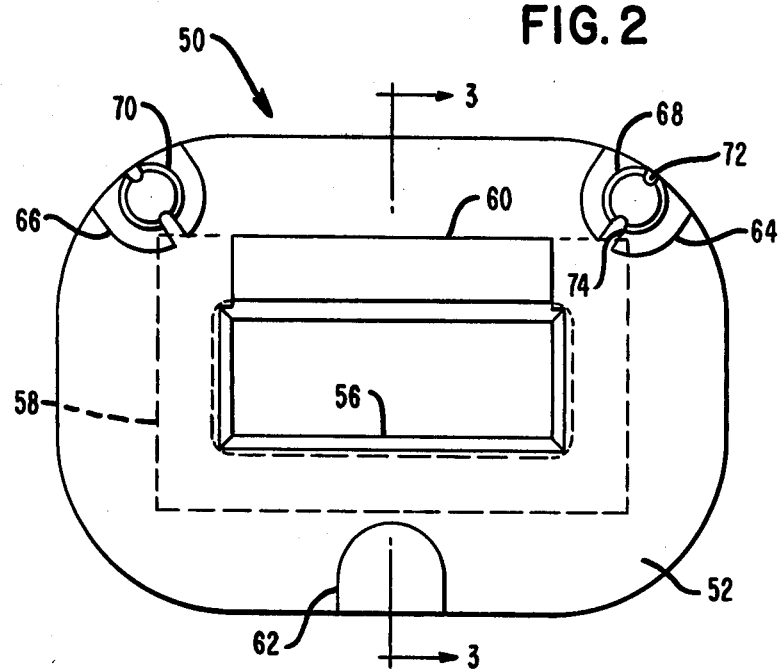
FIG. 2 is a top plan view showing one embodiment of a coil bobbin.
Figure 3:
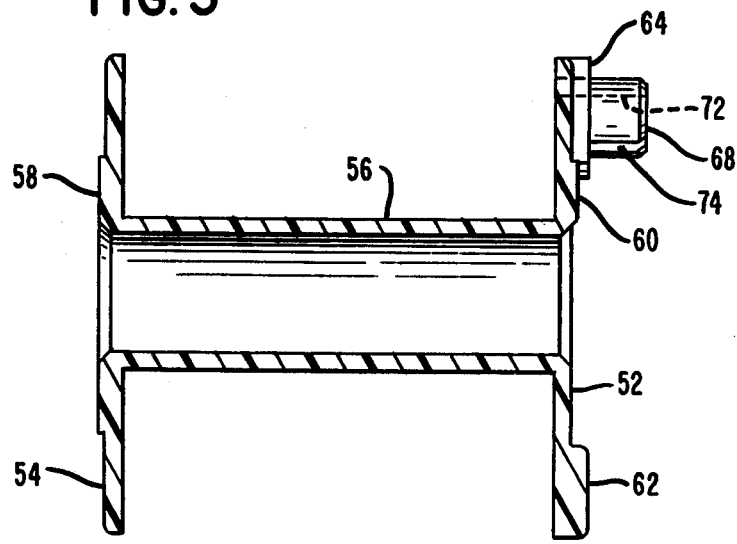
FIG. 3 is a sectional view taken along the line 3—3 of FIG. 2.

FIG. 2 shows a top view of a coil bobbin 50 which is secured to the circuit board 34. The bobbin 50 is made of a plastic material such as nylon or the like and includes flange ends 52 and 54 (FIG. 3) which may be considered to be somewhat rectangular-shaped and connected by a hollow rectangular-shaped central body portion 56. The flange 54 has a slightly raised portion 58 on the surface thereof and the flange 52 has a smaller and slightly raised portion 60, as best seen in FIG. 3. There are three pads 62, 64 and 66 (FIG. 2) on the outer surface of the flange 52 for providing a seating plane with the surface of the circuit board 34 when in place and supported thereby. Additionally, the three pads 62, 64 and 66 provide space between the surfaces of the circuit board 34 and bobbin 50 to enable flushing of any liquids or materials used in assembling the parts. A pair of posts 68 and 70, integral with the flange 52, are positioned at two corners of the flange 52 and extend outwardly from the pads 64 and 66. Each of the posts 68 and 70 has opposed grooves 72 and 74, with the outside groove 72 extending through the flange 52.

Figure 4:
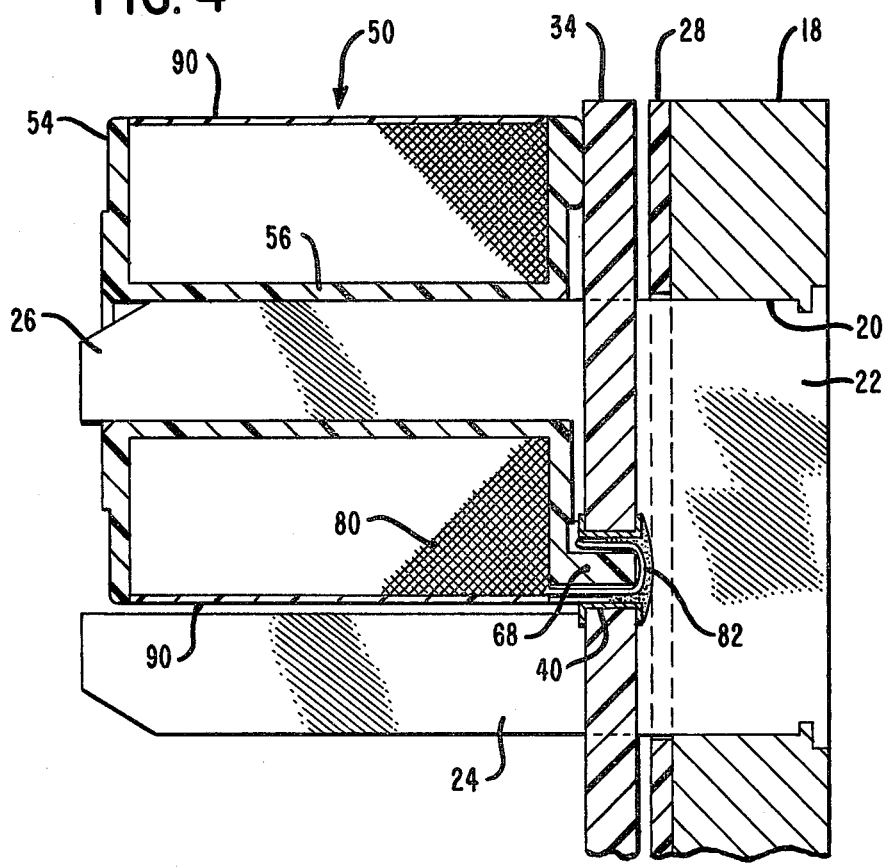
FIG. 4 is a sectional view showing the bobbin wound coil and circuit board assembly.
Figure 5:
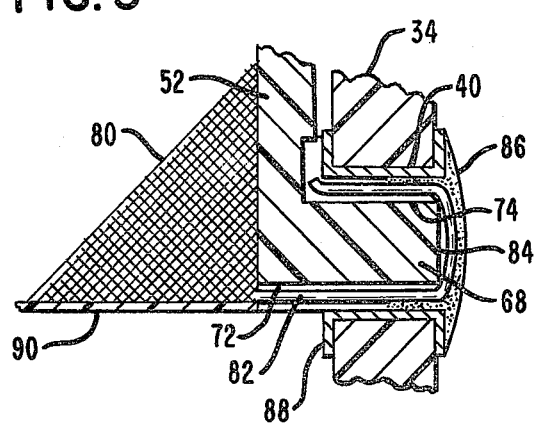
FIG. 5 is an enlarged view of the coil wiring connection with the circuit board.

FIG. 4 shows the assembly of a bobbin 50 and a circuit board 34 and includes in excess of 200 turns of copper magnet wire 80 wound on the bobbin in coil form. The coil of wire 80 is wrapped with several layers of tape 90 in well-known manner. The ends of the wire 80 are placed in the grooves 72 and 74 of the posts 68 and 70 and then the wound bobbin 50 is attached to the circuit board 34 with the posts 68 and 70 extending through the respective holes 40, 42 in the circuit board. As best understood from FIG. 5, each end 82 of the coil wire 80 is disposed in and along the one groove 72, across a tip 84 of the respective posts 68 and 70, and then in and along the other groove 74. After the wire ends 82 are seated in the grooves 72, 74 of the respective posts and the pads 62, 64, 66 of the bobbin 50 are placed firmly against the surface of the circuit board 34 with the posts 68 and 70 extending through the respective holes 40, 42, a portion of solder 86 is placed, as in a wave soldering or like operation, across the wire ends 82 on the tip 84 of the posts 68, 70 and over the copper lining, designated as 88, in and adjacent each hole 40, 42 in the circuit board 34. The backplate 18 carries the core members 22 secured thereto as by pressing same through the windows 20. The insulating spacer 28 is placed adjacent the backplate 18 with the core member poles 26 and 26 extending through the windows 32 of the spacer 28, through the windows 38 of the circuit board 34, and with outer pole 26 of core member 22 extending through the hollow body portion 56 of the bobbin 50 (FIG. 4).

It should be noted that the backplate 18 is made of aluminum, the core members 22 are made of silicon iron and the circuit board 34 is epoxy glass.

Figure 6:
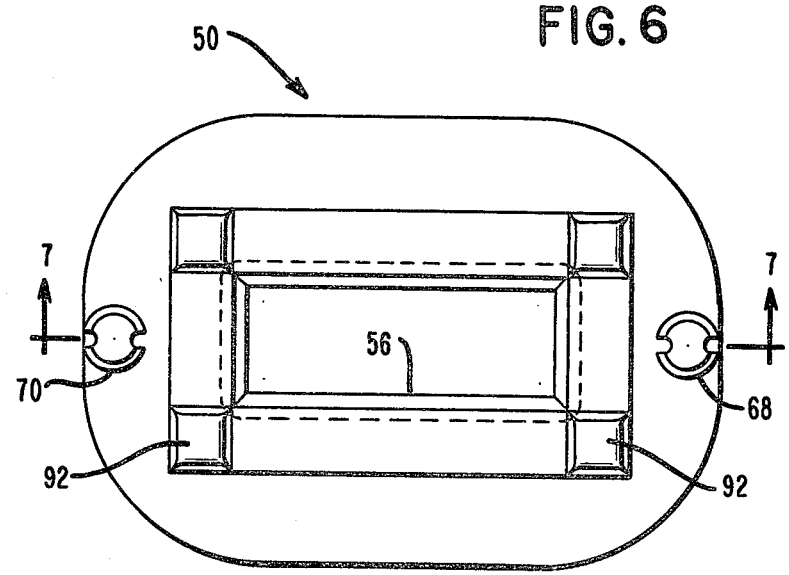
FIG. 6 is a top plan view showing another embodiment of the coil bobbin.
Figure 7:
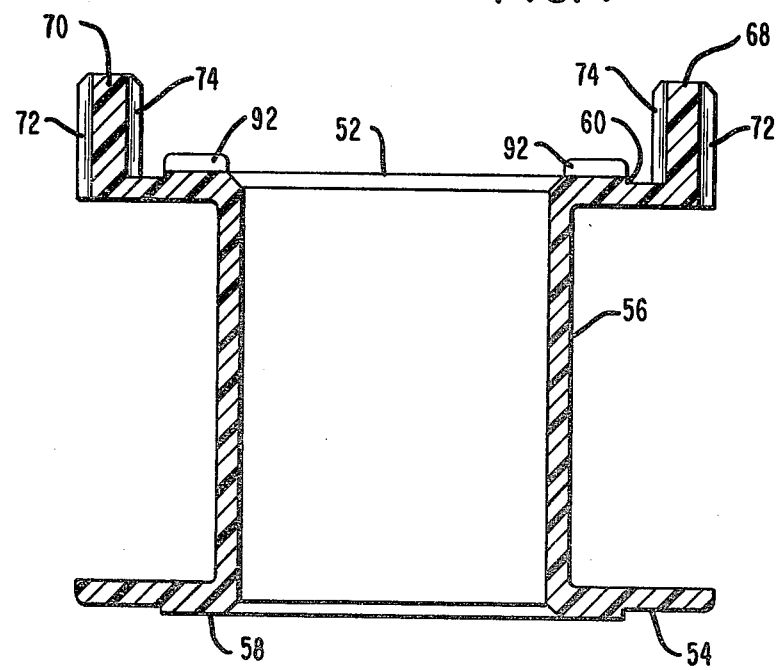
FIG. 7 is a sectional view taken along the line 7—7 of FIG. 6.

FIGS. 6 and 7 illustrate a different arrangement for certain structure of the coil bobbin 50. The flange ends 52 and 54 are the same shape and size as the ends shown in FIGS. 2 and 3, however the central body portion 56 is enlarged slightly to better accommodate the outer pole 26 in the assembly of the parts. The flange 54 includes the slightly raised portion 58 on the surface thereof and the flange 52 also has the raised portion 60. There are four square pads 92 arranged in symmetrical manner on the flange 52 for providing a seating plane with the surface of the circuit board 34 and holding the flange 52 in a stable condition when mounting the bobbin 50 on the circuit board 34. Further, the pads 92 provide space between the surfaces of the circuit board 34 and bobbin 50 to enable flushing of any liquids or materials used in the soldering operation. The posts 68 and 70, integral with the flange 52, are positioned along a centerline thereof. Each of the posts 68 and 70 has the opposed grooves 72 and 74 with the outside groove extending through the flange 52.

It is thus seen that herein shown and described is a wire matrix print head solenoid assembly having a plurality of print wire actuating coils directly connected with and supported from a printed circuit board. The apparatus of the present invention enables the accomplishment of the objects and advantages mentioned above, and while a preferred embodiment and a modification have been disclosed herein, other variations may occur to those skilled in the art. It is contemplated that all such variations not departing from the spirit and scope of the invention hereof, are to be construed in accordance with the following claims.

We claim:

1. A method of securing a coil carrying bobbin to a printed circuit board having conductors thereon, said bobbin having a pair of integral post-like extensions of a length to pass through apertures having copper linings in said board and each of said extensions having a pair of opposed grooves therein for accommodating one or the other end of a coil wire, comprising the steps of
    placing one end of the coil wire into one of the grooves and across the tip of one extension and into the other groove therein,
    placing the other end of the coil wire into one of the grooves and across the tip of the other extension and into the other groove therein,
    inserting the extensions with the ends of the coil wire in the grooves thereof into the apertures in said board, and
    soldering the wired tips of the extensions for securing thereof to the copper linings in the apertures in said board and for connecting the ends of the coil wire to the respective conductors of said board.

2. The method of claim 1 wherein said bobbin includes a plurality of raised portions on one end thereof for engaging with and seating on one surface of said board and leaving a space between said one bobbon end and said one board surface.

3. The method of claim 1 wherein the bobbin is generally rectangular in shape and said post-like extensions are located on corners of the bobbin for accommodating the ends of the coil wire in the assembly of the bobbin and the circuit board.

4. The method of claim 1 wherein the bobbin is generally rectangular in shape and the post-like extensions are located substantially along the centerline of and on the ends of the bobbin for accommodating the ends of the coil wire in the assembly of the bobbin and the circuit board.

5. A solenoid coil arrangement comprising a
    substrate having a plurality of copper-lined apertures therethrough,
    conductive material on one surface of the substrate and individually associated with the apertures, a
    coil carrying member having posts integral therewith and extending from one end thereof and positioned to be inserted into the apertures in the substrate, said posts having a pair of opposed grooves therein for accommodating the end of a coil wire in the grooves on the sides of each post and across the tip thereof, and
    means for fusing the end of the coil wire with the copper lining of each aperture and with the respective conductive material.

6. The arrangement of claim 5 wherein said substrate is a printed circuit board for carrying a plurality of coil carrying members.

7. The arrangement of claim 5 wherein said conductive material comprises runs of copper terminating at the individual apertures.

8. The arrangement of claim 5 wherein said coil carrying member comprises a generally rectangular-shaped bobbin having shaped posts substantially along the centerline thereof for accommodating the ends of the coil wire.

9. The combination of a printed circuit board having a plurality of copper-lined apertures therethrough and conductive material on the surface of the circuit board and individually and operably associated with the copper lining of the apertures, and a
    wire coil carrying member having a pair of posts integral therewith and extending through the apertures and having a pair of opposed grooves along the sides of the posts for accommodating the ends of the coil wire wherein the wire is placed within the grooves and across the tip of the respective post and exposed to enable soldering thereof with the copper lining for connection with the conductive material.

10. The combination of claim 9 wherein the wire coil carrying member comprises a generally rectangular shaped bobbin and said posts are positioned on corners of the bobbin.

11. The combination of claim 10 wherein said bobbin includes a plurality of raised portions on one end thereof for engaging with and seating on one surface of the circuit board and substantially encircling said apertures and providing a space between said one bobbin end and said one surface of the board.

12. The combination of claim 9 wherein the wire coil carrying member comprises a generally rectangular shaped bobbin and the posts are positioned on ends of the bobbin.

* * * * *